United States Patent [19]

Roesner

[11] 4,424,579
[45] Jan. 3, 1984

[54] MASK PROGRAMMABLE READ-ONLY MEMORY STACKED ABOVE A SEMICONDUCTOR SUBSTRATE

[75] Inventor: Bruce B. Roesner, San Diego, Calif.

[73] Assignee: Burroughs Corporation, Detroit, Mich.

[21] Appl. No.: 237,420

[22] Filed: Feb. 23, 1981

[51] Int. Cl.³ ............................................ G11C 17/06
[52] U.S. Cl. ................................. 365/105; 357/15; 357/45
[58] Field of Search ............... 365/105, 175; 357/45, 357/15, 59, 71

[56] References Cited

U.S. PATENT DOCUMENTS

| | | | |
|---|---|---|---|
| 3,749,987 | 7/1973 | Anantha | 357/15 |
| 3,906,540 | 9/1975 | Hollins | 357/15 |
| 4,070,654 | 1/1978 | Tachi | 357/15 |
| 4,099,260 | 7/1978 | Lynes et al. | 365/105 |
| 4,128,670 | 12/1978 | Gaensslen | 357/71 |
| 4,149,301 | 4/1979 | Cook | 357/51 |
| 4,149,302 | 4/1979 | Cook | 357/51 |
| 4,220,961 | 9/1980 | Werner | 357/15 |
| 4,254,428 | 3/1981 | Feth et al. | 357/59 |

FOREIGN PATENT DOCUMENTS

54-16990 2/1979 Japan ....................... 357/45
2009507 6/1979 United Kingdom .

Primary Examiner—James W. Moffitt
Attorney, Agent, or Firm—Charles J. Fassbender; J. Ronald Richbourg; Kevin R. Peterson

[57] ABSTRACT

In the disclosed read-only memory, address decode means for addressing information in the memory lie in a semiconductor substrate; an insulating layer covers the address decode means; an array of spaced-apart metal lines and semiconductor lines lies on the insulating layer over the address decode means; outputs from the address decode means respectively couple through the insulating layer to the metal lines and to the semiconductor lines; and a plurality of mask selectable electrical contacts between the metal lines and semiconductor lines forms a matrix of mask selectable diodes over the insulating layer representative of the information in the memory.

18 Claims, 10 Drawing Figures

MASK PROGRAMMABLE READ-ONLY MEMORY STACKED ABOVE A SEMICONDUCTOR SUBSTRATE

BACKGROUND OF THE INVENTION

This invention relates to the architecture of digital memories and digital computers as integrated on a single substrate—such as a semiconductor chip or wafer.

A continual problem in this field that the integrated circuits (IC) industry faces year after year is how to integrate more and more circuitry onto the substrate. Each year, millions of dollars in research are spend by the industry on this problem. And as a result, digital memories have advanced over the years from 64 bits/chip to 65,000 bits/chip; and digital computers—the smallest of which was once comprised of thousands of chips—are now packaged on a single chip.

Two techniques have been utilized to achieve this advancement in the art. They are making the area of the chips larger, and making the individual circuit components (e.g. transistors) smaller. Over the last ten years for example, chip areas have increased from $150 \times 150$ mils$^2$ to $300 \times 300$ mils$^2$; and FET transistor channel lengths have decreased from 8 $\mu$m to less than 2 $\mu$m.

Presently, the IC industry is spending additional millions of dollars on research to further increase the amount of circuitry on a chip by further increasing chip size. But as chip size is increased, yield rapidly decreases in a nonlinear fashion. For example, a process with $200 \times 200$ mils$^2$ chips having a 20% yield could be expected to have a yield of near 0% on chips of $400 \times 400$ mils$^2$.

This occurs because non-defective chips occur randomly in a wafer. Thus, doubling the sides of a $200 \times 200$ mil$^2$ chip in a particular process is equivalent to accepting only sets of four non-defective $200 \times 200$ mils$^2$ chips that occur side by side. But since the defect-free $200 \times 200$ mils$^2$ chips occur at random, the probability of having four of them occur side by side is near 0%.

To overcome this problem, the IC industry traditionally attempts to reduce the source of the defects. But this is a very complex and expensive approach because there are so many different defect sources. Also, the techniques for further reducing various particular defect sources are already being pushed to their limits.

Also, undercutting during any etching process is a major problem. This occurs because lateral dimensions are small to begin with, the slightest undercutting will aggravate any narrow width electronic phenomena—such as bird-beak for example. And this in turn can render the device inoperable.

Further, reducing the area of circuit components also requires that they be scaled in the vertical direction. Junction depths, for example, need to be shrunk. But this further limits the processing temperatures—otherwise the junction depths will increase through diffusion.

Another problem which the IC industry also spends millions of dollars on each year is how to increase the operating speed of the circuits on the chips. Again, many factors limit this speed of operation. But they include, for example, the existence of parasitic capacitances between the circuit components and the substrate, and high resistivities of various doped regions in the substrate. These limitations are amplified in greater detail in the Detailed Description.

Still another problem that is particularly associated with mask-programmable read-only memories and digital computers incorporating the same is how to reduce the time that is required to fill a particular customer's order. This is a problem because the chips are mask-programmable and their fabrication process varies for each customer. Thus, the chips cannot be fabricated until an order is received; and also, the fabrication process becomes longer as chip areas get larger and circuit components get smaller.

Therefore, a primary object of this invention is to provide an improved architecture for digital memories and digital computers as integrated on a single semiconductor substrate which mitigates all of the above problems.

BRIEF SUMMARY OF THE INVENTION

These and other objectives are accomplished by a stacked digital read-only memory comprised of address decode means being fabricated into a substrate and being disposed for addressing information in the memory; an insulating layer covering the address decode means; and an array of spaced-apart metal lines and semiconductor lines on the insulating layer over the address decode means. Outputs from the address decode means respectively couple through the insulating layer to the metal lines and semiconductor lines; and a plurality of selectable electrical contacts between the metal lines and semiconductor lines form a matrix of selectable diodes over the insulating layer representative of the information in the memory.

BRIEF DESCRIPTION OF THE DRAWINGS

Various features and advantages of the invention will best be understood with reference to the following detailed description and the accompanying drawings wherein.

DETAILED DESCRIPTION OF THE INVENTION

Figures 1, 2, 3:
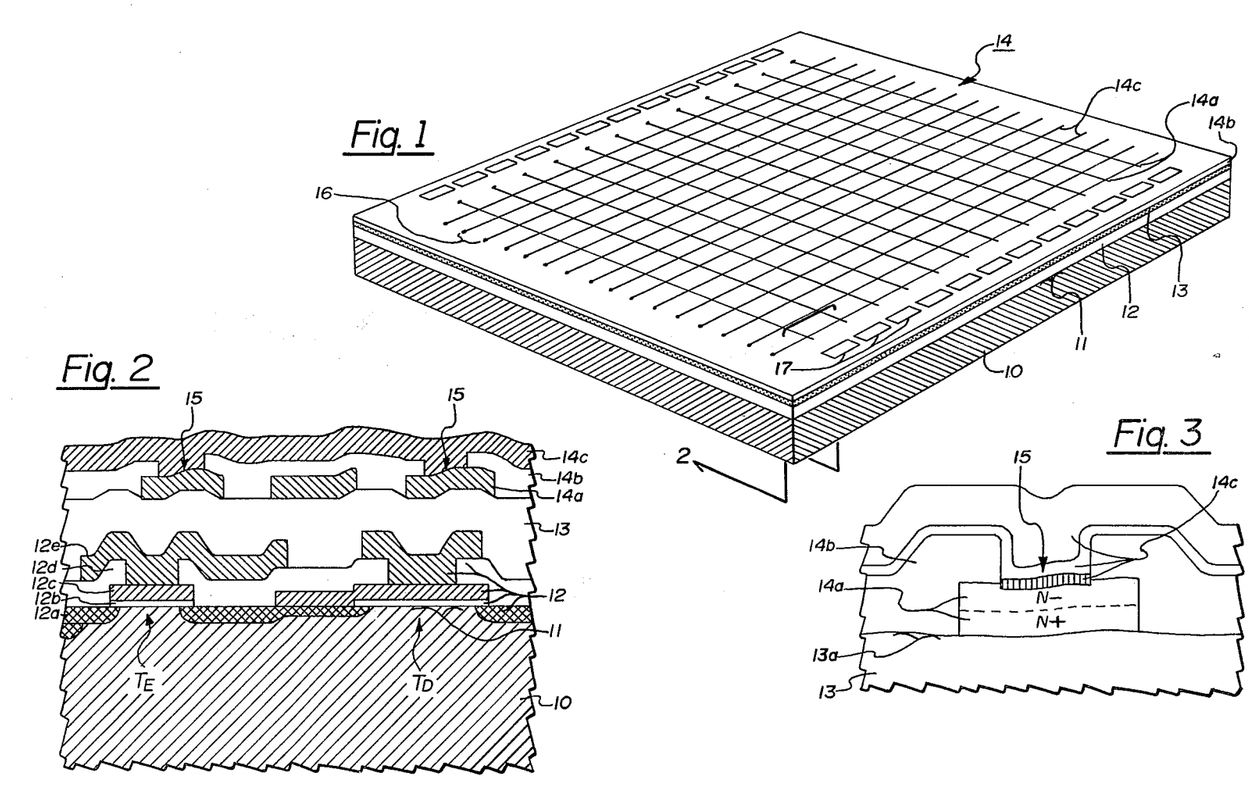
FIG. 1 is a pictorial view of a memory which comprises one embodiment of the invention.
FIG. 2 is a greatly enlarged cross-sectional view of a portion of the FIG. 1 memory.
FIG. 3 illustrates a preferred structure for the plurality of selectable electrical contacts in the memory of FIGS. 1 and 2.

Referring now to FIG. 1, the details of one preferred embodiment of the invention will be described. This embodiment includes a semiconductor substrate 10 having a surface 11 on which a plurality of interconnected field effect transistors are fabricated. These field effect transistors and their interconnections are indicated in general in FIG. 1 by reference numeral 12; and they are also indicated in greater detail in FIG. 2.

Overlying this plurality of interconnected transistors is an insulating layer 13; and on top of layer 13 is a read-only memory 14. Memory 14 is comprised of components 14a 14b, 14c, and 15. Component 14a is a plurality of spaced-apart semiconductor lines which lie directly on insulating layer 13. Component 14b is an insulating layer which covers lines 14a. And component 14c is a plurality of spaced-apart metal lines which lie on insulating layer 14b. These semiconductor lines and metal lines serve as select lines for the cells in memory 14.

To program memory 14, a plurality of Schottky diodes 15 are selectively made between lines 14a and 14c. These diodes are indicated in FIGS. 2 and 3. Each diode is formed by a contact between lines 14a and 14c; and the presence or absence of a diode indicates the information stored in the memory.

In other words, each crossing of one semiconductor line 14a and one metal line 14c forms one cell of memory 14. And the information in that cell is programmed by forming a selectable contact (i.e., forming a selectable Schottky diode) at the crossing. Then, depending upon whether positive or negative logic is used, the presence of a contact indicates either a logical 1 or a logical 0 while the absence of a contact indicates just the opposite.

Information is read from memory 14 by selectively addressing the memory cells. A decoder for these addresses is formed by the plurality of interconnected transistors 12. They include both depletion mode transistors $T_D$ and enhancement mode transistors $T_E$ as illustrated in FIG. 2. Reference numerals 12a, 12b, 12c, 12d, and 12e respectively indicate the source-drain, gate oxide, polysilicon gate, insulating layer between polysilicon and metal, and metal interconnects for these transistors.

Interconnections between these transistors and memory 14 are made through a plurality of apertures 16 which penetrate insulating layer 13. In the illustrated preferred embodiment of FIG. 1, the apertures 16 are distributed around the perimeter of substrate 10. This leaves the interior portion of substrate 10 open for other logic—that is, logic in addition to the memory address decoder—which is also formed by the interconnected transistors 12.

A plurality of metal bonding pads 17 also are distributed around the perimeter of substrate 10. They are used as I/O pins for sending external signals to and receiving signals from memory 14 and the other additional logic. Preferably, memory 14 together with this additional logic form a densely packaged digital computer, as will be described shortly in conjunction with FIGS. 6–10.

Turning now to FIG. 3, a preferred structure for each cell in memory 14 is illustrated in greater detail. In this structure, insulating layer 13 is comprised of $SiO_2$ and is 7,000 Å–10,000 Å thick. This relatively large thickness is preferred because it tends to smooth out surface 13a on which memory 14 is fabricated; and also, any capacitances between memory 14 and the underlying interconnected plurality of transistors 12 are essentially eliminated.

Each of the spaced-apart semiconductor lines 14a in the FIG. 3 structure is formed by a polycrystalline layer of N− semiconductor material in direct contact with a polycrystalline layer of N+ semiconductor material. The impurity concentration of the N− layer is $10^{14}$–$10^{17}$ dopant atoms/cm³; and the impurity concentration of the N+ layer is anything greater than $10^{20}$ atoms/cm³. These N− and N+ layers suitably are each 4,000 Å thick.

Preferably, these N− and N+ layers are fabricated by depositing either silicon or germanium which is doped in situ as deposited on surface 13a. Arsenic, phosphorous, and antimony are suitable dopant impurity atoms. These N− and N+ layers are annealed at temperatures above 600° C. to activate the dopant atoms. That is, the annealing causes the dopant atoms to take substitutional positions in the silicon/germanium polycrystalline lattice network.

Each of the spaced-apart metal lines 14c also preferably has a multilayered structure. The bottom layer, that is the layer closest to semiconductor lines 14a, is comprised of a noble metal—such as platinum for example. Suitably, this layer is 250 Å thick. After the noble metal is deposited, it is heated to 600° C. to form a compound (e.g., platinum silicide) with the underlying N− semiconductor layer, as indicated by the vertical crosshatch lines in FIG. 3.

That portion of the noble metal which lies on insulating layer 14b does not form a compound; and instead it is subsequently removed. Then a barrier metal, such as titanium tungsten, is deposited in its place. Suitably, the thickness of this barrier metal is 1,000 Å. Thereafter, a conductive metal, such as aluminum, is deposited on the titanium tungsten. Suitably, the thickness of this conductive metal is 8,000 Å.

With this structure, the conductive metal operates to minimize the resistance of the lines 14a. The barrier metal operates to prevent the conductive metal from diffusing through the semiconductor lines 14a. And the junction between the silicide of the noble metal and the underlying N− layer forms the Schottky diode 15.

Through experimental testing, Schottky diodes formed by the above structure have been found to have a turn-on voltage of 0.41±0.02 volts, a leakage current of $15 \times 10^{-9}$ amps, and a reverse breakdown voltage of 10 volts. Also, the resistance of the semiconductor lines 14a and the metal lines 14c have been found to be 15 ohms per square and 0.04 ohms per square respectively. An even lower resistivity of the semiconductor lines 14a may be achieved, as an alternative, by adding a layer of molybdenum silicide between the N+ semiconductor layer and the insulating surface 13a.

Figure 4:
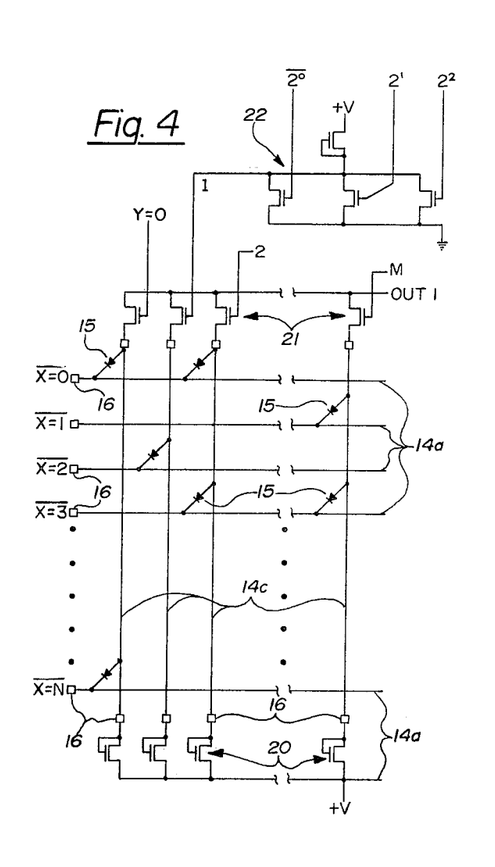
FIG. 4 is a detailed circuit diagram of the memory of FIGS. 1-3 with one preferred addressing means.

Turning now to FIG. 4, one preferred means for reading information from memory 14 will be described. In that Figure, reference numerals 14a, 14c, and 15 again respectively indicate the spaced-apart semiconductor lines, metal lines, and selectable diodes as described above.

Also illustrated in FIG. 4 are a plurality of transistors 20 and 21. These transistors lie beneath insulating layer 13 and are a portion of the previously described interconnected transistors 12. Transistors 20 are depletion devices (such as transistors $T_D$) whereas transistors 21 are enhancement devices (such as transistors $T_E$).

Also lying beneath insulating layer 13 as a portion of the interconnected transistors 12 is an X address decoder and a Y address decoder. Each semiconductor line 14a is driven by an inverted output of the X address decoder; and the gate of each of the transistors 21 is driven by a noninverted output of the Y address decoder. One suitable circuit for these decoders is indicated by reference numeral 22 as an example. Its outputs are coupled to memory 14 through the apertures 14.

To read information from a particular memory cell, the X address decoder generates a low logic level on the semiconductor line 16 which forms that cell; and the Y address decoder simultaneously generates a high logic level on the gate of the transistor 21 connected to the metal line 14c which forms that cell. If a diode is present in that cell, then current will flow through the diode thereby causing a voltage drop across the depletion transistor 20 which connects to that diode, thus forcing the memory output signal OUT 1 low. Conversely, if no diode is present, no current will flow; and thus the memory output signal OUT 1 will be high.

Figure 5:
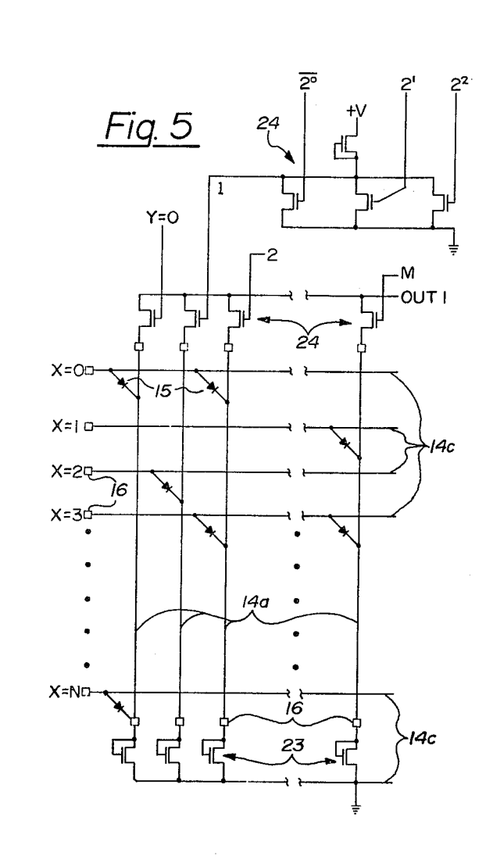
FIG. 5 is a detailed circuit diagram of the memory of FIGS. 1-3 with another preferred addressing means.

An alternative preferred means for reading information in memory 14 is illustrated in FIG. 5. There, depletion transistors 23 couple to one end of the semiconductor lines 14a; and enhancement transistors 24 couple to the opposite ends of those lines. Also, each of the metal lines is driven by a noninverting output of an X address decoder; and the gate of each of the transistors 24 is driven by a noninverting output of a Y address decoder—one of which is indicated by reference numeral 25 as an example.

To read information from a particular memory cell, a high logic level is generated by the X address decoder on the metal line 14c which forms a portion of that cell; and a high logic level is simultaneously generated by the Y address decoder on the gate of the transistor 24 connected to the semiconductor line which forms a portion of that cell. If a diode exists in that cell, then current flows through that diode and generates a voltage drop across the depletion transistor 23, which in turn forces the memory output signal OUT 1 to a high logic level. Conversely, if no diode exists in the cell, then the ground voltage level to which the depletion transistors 23 are connected becomes the memory output signal.

A multiple output memory may also be constructed in accordance with FIGS. 4 and 5. In a FIG. 4 type version, respective sets of metal lines 14c exist for each output; while a single set of semiconductor lines 14a is shared by all of the outputs. That is, the metal lines 14c which extend across the chip as illustrated in FIG. 1 are partitioned into N groups where N is the number of memory outputs. Each partitioned group of metal lines then has its own separate set of transistors 20 and 21 for addressing cells within those groups in parallel. By comparison, in a FIG. 5 type version, respective sets of semiconductor lines 14a exist for each output; a single set of metal lines 14c is shared by all of the outputs; and each set of semiconductor lines has its own set of transistors 23 and 24.

For those memories having a relatively large number of outputs, care must be taken to insure that the X-decoder is able to supply the total current needed to generate a high voltage at each output. For example, if the memory has thirty outputs OUT 1 through OUT 30; and the Y decoder has ten outputs (M=10), then each X-decoder output could possibly connect to 300 diodes.

In such a case, the drive current of the X-decoder can be reduced by a factor of M by duplicating the selection transistors 21 between the load transistors 20 and the +V source in the FIG. 4 version, and by duplicating the selection transistors 24 between the load transistors 23 and the +V source in the FIG. 5 version. Then, the X-decoder would only need to supply current to one diode for each memory output.

Alternatively, the same result could be achieved with a "push-pull" type of address decoder, wherein only one metal line is driven high and one semiconductor line is simultaneously driven low in each partitioned group that forms a memory output. That is, unselected metal lines would have a low voltage impressed on them; and unselected semiconductor lines would have a high voltage. Then only the one diode that is located at the intersection of the metal line with the high voltage and the semiconductor line with the low voltage could turn-on.

Figure 6:
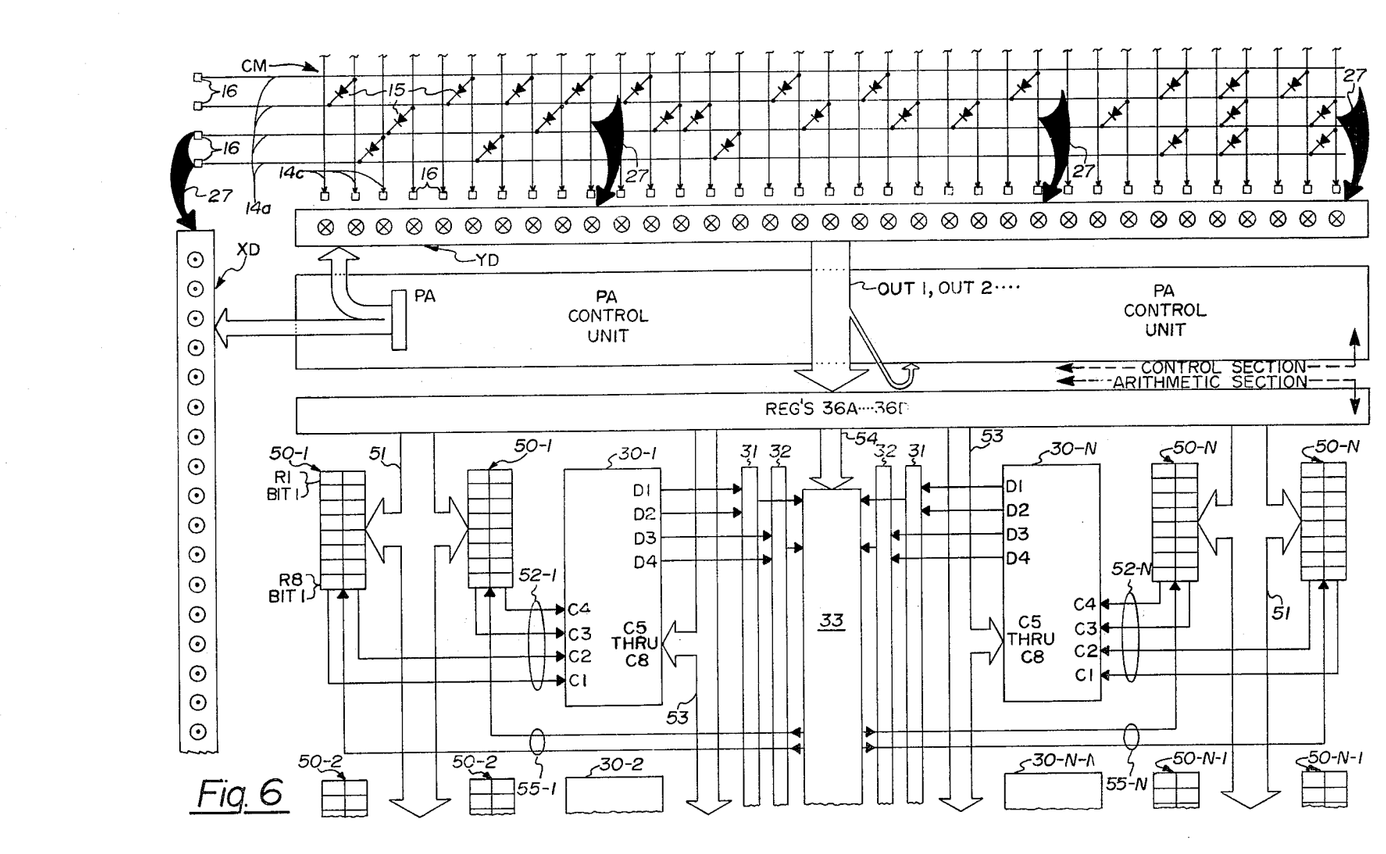
FIG. 6 illustrates a digital computer with a stacked control section that is constructed in accordance with FIGS. 1-5.

Referring now to FIG. 6, a densely packaged digital computer which incorporates the above-described memory will be described. Basically, this computer is an improvement over an invention entitled "Digital Computer Having Programmable Structure" by Hanan Potash et al., U.S. Pat. No. 4,346,438 assigned to the assignee of this invention. All of the teachings of this issued patent are incorporated herein by reference.

Briefly, the computer of FIG. 6 is divided into an arithmetic section and a control section. One preferred physical layout for the arithmetic section in a semiconductor chip is given in FIG. 8 of the above-cited U.S. Pat. No. 4,346,438; and that layout, along with the reference numerals, is here reproduced as the bottom portion of FIG. 6. In addition here however, a preferred physical layout for the control section is also illustrated as the top portion of FIG. 6.

The illustrated control section includes a control memory CM, an X address decoder XD, and a Y address decoder YD. Memory CM and decoders XD and YD are fabricated as described above. Thus, decoders XD and YD are fabricated in the semiconductor substrate along with the arithmetic section; while control memory CM is fabricated on an insulating layer which overlies the substrate. Several large arrows 27 in FIG. 6 indicate that in the actual physical computer, control memory CM is flipped over to cover everything below decoder YD.

Outputs from decoder XD which carry signals to select a particular memory cell come out of the plane of FIG. 6; and thus they are indicated as a circle with an internal dot. Conversely, inputs to decoder YD come from control memory CM into the plane of FIG. 6, and thus they are indicated as a circle with an internal X. These inputs and outputs of the decoders couple to memory CM through the apertures 16.

Also included in the control portion of the FIG. 6 computer is a present address register PA. This register holds the address which is sent to the above-described decoders XD and YD. Various control logic, such as that described in the above reference, may be utilized to generate the address in register PA; and the physical space occupied by this control logic is indicated in FIG. 6.

Output signals OUT 1, OUT 2, . . . from the addressed cells in the control memory are sent through decoder YD to several control memory registers 36a–36d. The actual number of output signals may vary in any particular design, depending upon how the information in control memory CM is encoded. In one preferred embodiment, a total of 32 output signals exists. Thus, decoder YD is portioned into 32 portions, each of which is as illustrated in FIGS. 4 and 5.

One significant feature of the above-described computer architecture is its high packing density. By overlying the arithmetic section, the PA control logic, and decoders XD and YD with control memory CM, the number of cells in control memory CM is substantially increased over that which is feasible when control memory CM is fabricated in the semiconductor substrate.

In one preferred embodiment for example, substrate 10 is 310 mils by 310 mils. Also in this embodiment, semiconductor lines 14a are 4 μm wide; their spacing is 2 μm; metal lines 14c are 2½ μm wide; and their spacing is 2½ μm. Thus, the total number of cells in this control memory exceeds 1,000,000; and the total number of 32-bit wide control words exceeds 30,000.

Another important feature of the disclosed computer is that since control memory CM is the topmost physical structure, its programming occurs late in the fabrication process. Thus, the FIG. 6 computer can be processed up to the stage where the plurality of spaced apart metal lines 14c are to be formed; and at that point, it can be stockpiled. Then at some later date, the stockpiled device can be programmed to meet the particular needs of a customer.

This programming is carried out by simply fabricating the metal lines 14c and tailoring their contacts to the underlying semiconductor lines 14a. Clearly, this ability to program late in the fabrication process significantly reduces the lead time which is required to fill a customer's order.

Still another feature of the above-described computer is the high speed at which information may be read from control memory CM. In part, this speed is due to the very small parasitic capacitance which exists between the control memory and the underlying active devices.

This small capacitance is due to the presence of the previously described thick insulating layer 13. Typically, the capacitance between memory CM and the underlying active devices is only $4 \times 10^3$ pf/cm$^2$. By comparison, if memory CM were formed in a semiconductor substrate, the typical capacitance between each diode in that memory and the substrate would be $70 \times 10^3$ pf/cm$^2$.

In addition, the high speed with which information can be read from control memory CM is due to the low resistivity (15 ohms per square) of the spaced-apart semiconductor lines 14a which results when they are fabricated as described above. This low resistivity is due to the high concentration of dopant impurity atoms in the N+ layer (greater than $10^{20}$ atoms/cm$^3$).

By comparison, the N+ layer which is formed beneath an N− layer in a semiconductor substrate typically has a resistivity of greater than 100 ohms per square. This high resistivity is in part due to the fact that the concentration of the N+ layer in a semiconductor substrate must be limited; otherwise, the parasitic diode that is formed between the N+ layer and the substrate becomes leaky. This is not a problem in the present invention because here, the N+ layer forms no P-N junction with any substrate.

Also, when an N+ region is formed under an N− region in a semiconductor substrate, that N+ region can only be formed by high energy ion implantation. With that technique, dopant atoms are implanted through the N− region to the underlying N+ region. However, some portion of the implanted atoms always stops in the N+ region, which raises the doping concentration there.

But the doping concentration in the N− region must stay below approximately $4 \times 10^{17}$ atoms/cm$^3$; otherwise, any contact that it makes with a metal layer will be ohmic. It follows therefore that the doping concentration which forms the N+ region must also be limited; and this in turn raises its resistivity.

Another important feature of the above-described invention is that since memory 14 is formed on an insulating layer above the substrate, the diodes in that memory are not subject to failure due to faults in the underlying substrate lattice. Ideally, a semiconductor substrate is single crystalline; but as a practical matter, crystal defects do occur in commercially available substrates. And if a diode is formed in a substrate where these faults occur, that diode will leak under a reverse bias.

Also, the diodes 15 are highly insensitive to crystalline defects in the spaced-apart semiconductor lines 14a. Thus, the previously described typical electrical characteristics of the diodes 15 occur even though the semiconductor lines 14a are polycrystalline. P-N junction diodes by comparison are so leaky that they are inoperable when formed in a polycrystalline material.

Still another important feature of the invention relates to the interconnecting of the array 14 to the underlying address decoders XD and YD. As illustrated in FIGS. 1 and 6, the apertures 16 through which these interconnections occur preferably are located only at the perimeter of substrate 10, and only in a regular sequence. This is important because it means that nearly all of the interconnected transistors 12 (i.e.—all of them at the chip's interior) can be formed with minimal dimensions and without regard to the overlying diode array; while only a very small fraction of the interconnected transistors 12 (i.e.—those at the chip's perimeter) might possibly need to be enlarged to avoid any misalignment problems with the apertures 16.

Figure 7:
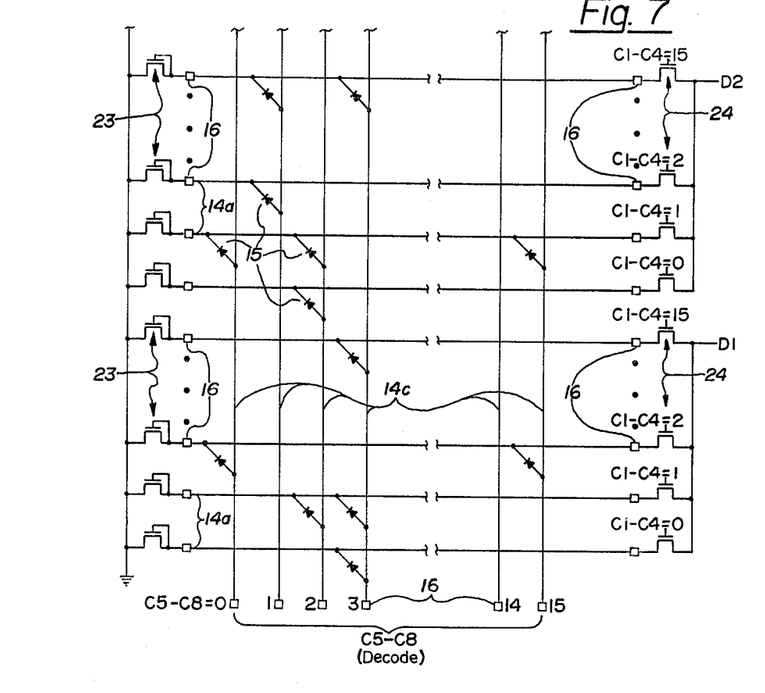
FIG. 7 is a detailed circuit diagram of an arithmetic section of a digital computer which is constructed in accordance with FIGS. 1-3.
Figure 8:
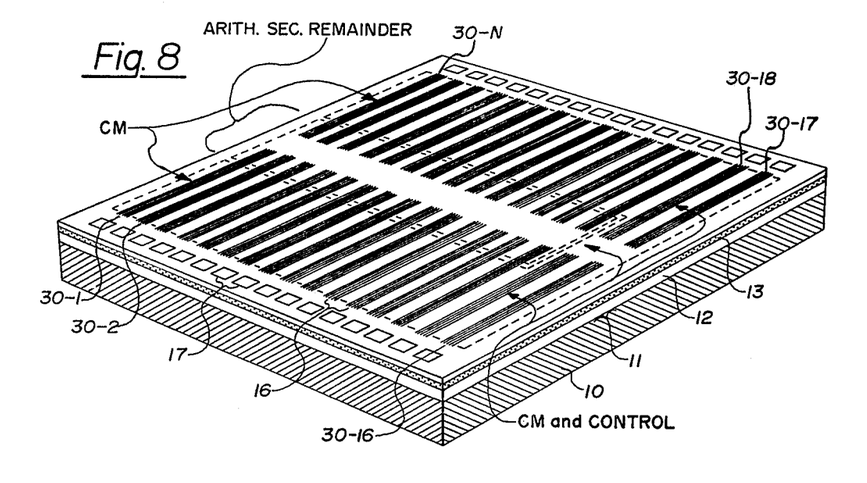
FIG. 8 is a pictorial view of a digital computer having a stacked arithmetic section which is constructed in accordance with FIG. 7.

Turning next to FIGS. 7 and 8, the details of another embodiment of the invention will be described. Basically, in this embodiment, a substantial portion of the arithmetic section of the FIG. 6 computer is formed by several read-only memories which lie on insulating layer 13 above semiconductor substrate 10; while the remaining portion of the computer, including control memory CM, lies in substrate 10.

That portion of the arithmetic section which is formed on insulating layer 13 is the plurality of memories 30-1 through 30-N. As described in the above-cited U.S. Pat. No. 4,346,438, each of these memories has first address inputs C1–C4, second address inputs C5–C8, and four outputs D1–D4. Inputs C1–C4 receive four data bits of like power from four different registers; inputs C5–C8 simultaneously receive control signals specifying transformations to be performed on the data bits; and in response, output signals D1–D4 are generated to represent the transformed data bits.

A preferred embodiment of one of the memories 30-1 through 30-N is illustrated in FIG. 7. This memory is similar to that described above in conjunction with FIGS. 1 through 5; and in particular, reference numerals 14a, 14c, and 15 again respectively indicate pluralities of spaced-apart semiconductor lines, metal lines, and diodes formed by contacts between those lines. But the selectable diodes 15 in these memories represent transformations of the data bits that are applied to address inputs C1–C4.

The number of semiconductor lines 14a in each of the memories 30-1 through 30-N is equal to the number of different combinations of input signals on the first address inputs C1–C4 times the number of outputs D1–D4. Also, the number of metal lines in each of the memories 30-1 through 30-N is equal to the number of different combinations of input signals on the second address inputs C5–C8. All of these lines are arranged as illustrated in FIG. 7.

In operation, decoded first address input signals are respectively applied to the gates of the transistors 26. Similarly, decoded second address signals are respectively applied to the metal lines 14c. Thus, each control code that is received on the second address inputs C5–C8 generates a high logic level on a particular one of the metal lines 14c. And a diode 15 selectively connects between that one metal line and a semiconductor line depending upon whether the transformation of the first address bits which select that metal line is a 1 or a 0.

A pictorial view of how the FIG. 7 memories preferably are disposed over insulating layer 13 is illustrated in FIG. 8. The number of memories which are there disposed is equal to the number of bits in the data words that are operated on by the arithmetic section of the computer. In the illustrated preferred embodiment, there are 32 bits per data word; and thus, 32 of the FIG. 7 memories are required. Memory 30-1, for example, is one of the FIG. 7 memories.

Also in FIG. 8, that portion of the semiconductor substrate which is occupied by the remainder of the arithmetic section is labeled and enclosed by a dashed line. Registers 50-1 through 50-N, adders 31 and 32, and shifter 33 are included in this section. All of the remaining portion of the semiconductor substrate is then available for implementing control memory CM in its accompanying control logic.

Figure 9:
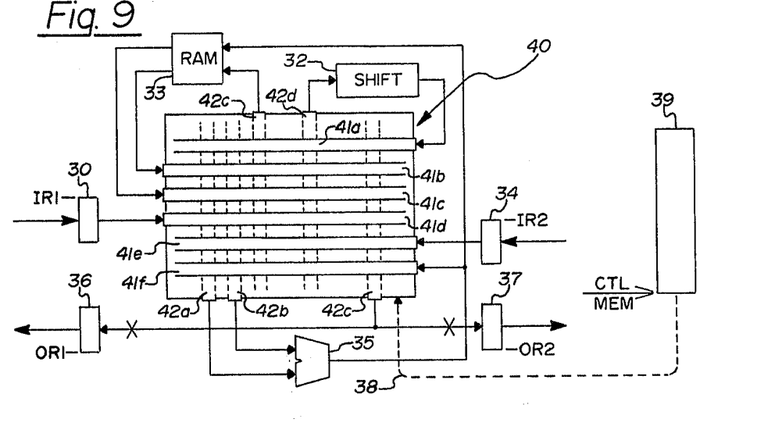
FIG. 9 illustrates a digital computer having a stacked programmable interconnect matrix which is constructed in accordance with FIGS. 1-3.
Figure 10:
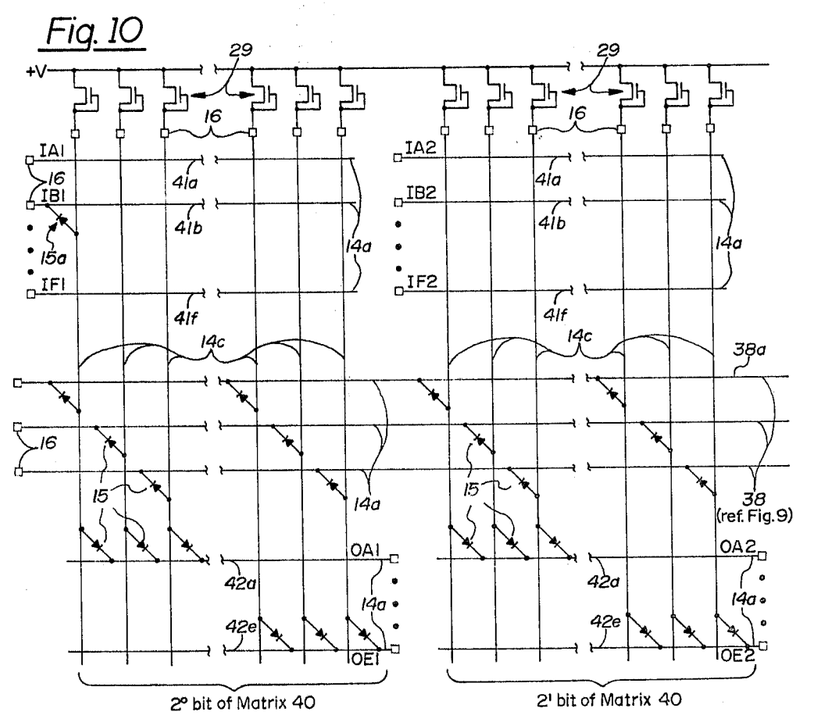
FIG. 10 is a detailed circuit diagram of a preferred embodiment for the stacked interconnect matrix of FIG. 9.

With reference now to FIGS. 9 and 10, still another embodiment of the invention will be described. Basically, this embodiment is an improvement on a digital computer described in a U.S. Pat. No. 4,327,355 entitled "Digital Device with Interconnect Matrix" by Hanan Potash et al, and assigned to the assignee of this invention. All of the teachings of this patent are herein incorporated by reference.

FIG. 3 of that reference, along with the accompanying reference numerals, is reproduced here as FIG. 9. In that Figure, reference numeral 40 indicates a programmable interconnect matrix. And in the present invention matrix 40 is fabricated on insulating layer 13 above semiconductor substrate 10; while all of the remaining components in FIG. 9 are fabricated beneath insulating layer 13 in substrate 10.

Preferably, interconnect matrix 40 is constructed on insulating layer 13 as illustrated in FIG. 10. In that Figure, reference numerals 14a, 14c, and 15 again respectively indicate pluralities of spaced-apart semiconductor lines, metal lines, and Schottky diodes between the semiconductor and metal lines. Component 14a, 14c, and 15 are formed as was previously described in conjunction with FIGS. 2 and 3.

FIG. 10 is symmetrically divided into two halves. The left half of FIG. 10 illustrates that portion of matrix 40 which interconnects bits of the $2^0$ power; while the right half of FIG. 10 illustrates that portion of matrix 40 which interconnects bits of the $2^1$ power. In a 32 bit computer, the left half portion of FIG. 10 (or equivalently the right half portion) is repeated 32 times.

Signals IA1, IA2 . . . IE1 respectively indicate signals of the $2^0$ power on input buses 41a, 41b,–41f. Similarly, signals IA2, IB2–IF2 represent signals of the $2^1$ power on those input buses. Also, signals OA1–OE1 represent signals of the $2^0$ power on output buses 42a–42e; and signals OA2–OE2 represent signals of the $2^1$ power on those output buses.

In operation, signals on the input buses are selectively transferred to the output buses in response to control signals on control lines 38. One control line exists for each selectable transfer; and in FIG. 10, three control lines are illustrated as an example.

Diodes 15 are symmetrically disposed between control lines 38 and semiconductor lines 14c. That is, these diodes are not selectably placed; but instead, they are always placed as illustrated. Similarly, the diodes 15 between output lines 42a–42e and metal lines 14c are not selectably placed; but instead, they also are always placed as illustrated.

By comparison, the location of the diodes 15 between the semiconductor lines which form input buses 41a–41f and the metal lines 14c is selectable. Also, only one diode can be placed between any one particular metal line 14c and the input buses 41a–41f. In other words, each metal line 14c interconnects one input bus line, one control line, and one output line through respective diodes. And signals on that one input bus line are transferred to the one output line in response to a high logic signal on the one control line.

When low logic levels are generated on all of the control lines 38, the voltage level on all of the metal lines 14c will be low. Thus, a logical low will also be generated on output lines 42a–42e. But when a high logic level is generated on one control line, such as line 38a, the diodes 15 which are connected to that control line turn off. Thus, the metal lines 14c which connect to those turned off diodes are able to charge to a high logic level. This charging either will or will not occur depending upon the signal or the input bus which connects to that metal line through a selectable diode.

Suppose for example that selectable diode 15a is placed as illustrated. Then, if input signal IB1 is low, output signal OA1 will also be low because the metal line 14c which connects to diode 15a will be pulled low through that diode. Conversely, if input signal IB1 is high, then diode 15a will be turned off; metal line 14c connected to diode 15a will charge through a depletion transistor 29; and output signal OA1 will go high.

Thus in this embodiment of the invention, the matrix of diodes on top of insulating layer 13 are not interconnected as a memory; but instead, they are interconnected to form a plurality of AND-OR gates. Each gate is comprised of one metal line 14c and three diodes 15 which connect to it. One of those three diodes connects to one of the output lines 42a–42e, and it performs the OR function; while the other two diodes connect to one control line and one input line, and they perform the AND function.

Several preferred embodiments of the invention have now been described in detail. In addition, however, many modifications and changes may be made to these details without departing from the nature and spirit of the invention. For example, the N-type semiconductor layers in the above-described embodiments can be replaced with P-type semiconductor layers. These include layers 14a, 14', and 50. Accordingly, it is to be understood that the invention is not limited to said details but is defined by the appended claims.

What is claimed is:

1. A mask programmable read-only memory having memory cells stacked above a semiconductor substrate comprised of:

a. address decode means integrated into a surface of said substrate for addressing said cells in said memory;

b. a first insulating layer covering said address decode means and said surface;

c. an array of spaced-apart memory cell select lines on said first insulating layer including:
  i. a plurality of spaced-apart semiconductor lines formed on said first insulating layer;
  ii. a second insulating layer formed over said semiconductor lines; and
  iii. a plurality of spaced-apart metal lines formed over said second insulating layer and arranged orthogonal to said semiconductor lines;

d. outputs from said address decode means respectively coupled through said first insulating layer to said select lines wherein each cell of said memory is formed at an intersection of one of said semiconductor lines and one of said metal lines and further includes a mask selectable Schottky diode at select ones of said intersections representative of the information in said cell.

2. A memory according to claim 1 wherein each of said semiconductor lines includes an N− polycrystalline semiconductor layer, and wherein said mask selectable diodes are formed by respective metallic junctions in said N− layer.

3. A memory according to claim 2 wherein each of said semiconductor lines further includes an N+ layer and a metal layer in contact with said N+ layer.

4. A memory according to claim 1 wherein each of said metal lines includes consecutive layers of a noble metal compound, a barrier metal, and a conductive metal; with said noble metal compound forming a portion of said mask selectable diode in each cell.

5. A memory according to claim 1 wherein said address decode means includes means for sensing voltage levels on said metal lines as output signals of said memory.

6. A memory according to claim 1 wherein said address decode means includes means for sensing voltage levels on said semiconductor lines as output signals of said memory.

7. A diode memory fabricated over an integrated circuit in a semiconductor substrate comprising:
  a. a first insulating layer formed over said integrated circuit;
  b. first spaced-apart conductors formed on said first insulating layer and being made of a double layer polycrystalline material wherein a first layer adjacent said first insulating layer is comprised of N+ polycrystalline material having a relatively high concentration of dopant material and an adjacent overlying second layer is comprised of N− polycrystalline material having a relatively low concentration of dopant material;
  c. a second insulating layer formed on said first insulating layer covering said first conductors except at predetermined locations;
  d. second spaced-apart conductors formed on said second insulating layer so as to cross over and above said first spaced-apart conductors;
  e. a plurality of Schottky diodes formed between said first and second conductors at said predetermined locations; and
  f. electrical connection means passing through said insulating layers for electrically interconnecting particular ones of said first and second conductors to particular portions of said integrated circuitry.

8. The invention in accordance with claim 7, wherein said integrated circuit in said semiconductor substrate includes addressing and sensing circuitry for said diode memory, and wherein said electrical connection means provides interconnections between said lines and said addressing and sensing circuitry.

9. The invention in accordance with claim 7, wherein each Schottky diode provided at a crossing includes a layer forming a compound with said N− polycrystalline layer so as to create a Schottky barrier junction at the interface therebetween, and conductive means electrically connecting said compound to the respective other line at the crossing.

10. The invention in accordance with claim 9, wherein said conductive means includes a barrier metal layer provided between said compound and said other line.

11. The invention in accordance with claim 10, wherein the concentration of dopant material in said N− polycrystalline layer is $10^{14}$–$10^{17}$ dopant atoms/cm$^3$ and the concentration of dopant in said N+ polycrystalline layer is greater than about $10^{19}$ atoms/cm$^3$.

12. An electrical structure incorporating a Schottky diode comprising:
  a. an insulating layer;
  b. an N+ polycrystalline layer having a relatively high concentration of dopant material formed on said insulating layer;
  c. an N− polycrystalline layer having a relatively low concentration of dopant material formed on said N+ polycrystalline layer;
  d. a metal layer provided on said N− polycrystalline layer forming a compound therewith such that a Schottky barrier junction is created at the interface between said compound and said N− polycrystalline layer;
  e. a barrier metal layer formed on said compound; and
  f. a conductive metal layer formed on said barrier metal layer.

13. The invention in accordance with claim 12, wherein a plurality of said diodes are provided on said insulating layer, wherein first diode interconnection means are provided electrically interconnecting said polycrystalline layers of said diodes and second diode interconnection means are provided interconnecting said conductive layers of said diodes.

14. The invention in accordance with claim 13, wherein said insulating layer is provided on a substrate incorporating an integrated circuit, and wherein electrical connection means are provided passing through said insulating layer for interconnecting said first and second diode interconnection means to particular portions of said integrated circuit.

15. The invention in accordance with claim 14, wherein said first diode interconnection means comprises first spaced apart lines and said second diode interconnection means comprises second spaced apart lines crossing said first lines and insulated therefrom, wherein said first lines are formed as extensions of said polycrystalline layers and said second lines are formed as extensions of said conductive and barrier metal layers, and wherein said diodes are selectively provided at particular crossing locations of said first and second lines.

16. The invention in accordance with claim 15, wherein a silicide layer is provided between said insulating layer and said N+ polycrystalline layer.

17. The invention in accordance with claim 15, wherein the concentration of dopant material in said N− polycrystalline layer is $10^{14}$–$10^{17}$ dopant atoms/cm$^3$ and the concentration of dopant in said N+ polycrystalline layer is greater than about $10^{19}$ atoms/cm$^3$.

18. The invention in accordance with claim 17, wherein the thickness of said insulating layer is of the same order as the thickness of said polycrystalline layers.

* * * * *